(12) United States Patent
Ashman et al.

(10) Patent No.: US 6,368,045 B1
(45) Date of Patent: Apr. 9, 2002

(54) MULTIPLE INDEX TAPE FEEDER AND METHOD

(75) Inventors: Damon Scott Ashman; Charles Andrew Coots, both of Binghamton; Mark Jonathan Erickson, Apalachin; Stanislaw Wladyslaw Janisiewicz, Endwell; Charles H. Dunlap, Kirkwood; John I. Burgin, Jr., Binghamton, all of NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 09/543,417

(22) Filed: Apr. 5, 2000

(51) Int. Cl.[7] .............................................. H05K 13/02
(52) U.S. Cl. .................. 414/411; 414/403; 414/416.05
(58) Field of Search ................ 414/411, 403, 414/416, 416.05

(56) References Cited

U.S. PATENT DOCUMENTS

| | | | | |
|---|---|---|---|---|
| 4,887,778 A | * | 12/1989 | Soth et al. ................... | 226/109 |
| 5,299,902 A | * | 4/1994 | Fujiwara et al. ............ | 414/416 |
| 5,588,614 A | * | 12/1996 | Takada et al. ........... | 242/538.2 |
| 5,725,140 A | * | 3/1998 | Weber et al. ................ | 226/139 |
| 5,762,754 A | * | 6/1998 | Kondo et al. ........... | 414/416 X |
| 6,026,885 A | * | 2/2000 | Mogi et al. ............. | 414/416 X |

FOREIGN PATENT DOCUMENTS

JP          11-180633       *  7/1999

* cited by examiner

*Primary Examiner*—Steven A. Bratlie
(74) *Attorney, Agent, or Firm*—Burns, Doane, Swecker & Mathis, L.L.P.

(57) ABSTRACT

Disclosed is a tape feeder for use with electronic assembly machines. The feeder simultaneously presents multiple electronic components in a pick up zone for access by a pick up head having a plurality of pick up spindles. The effective feed rate for the electronic components is increased and waiting time for the pick up head is reduced.

23 Claims, 9 Drawing Sheets

MULTIPLE INDEX TAPE FEEDER AND METHOD

FIELD OF THE INVENTION

The present invention relates to feeders for feeding electronic components to automatic electronic assembly equipment.

BACKGROUND OF THE INVENTION

Automated assembly apparatus have been known for some time that utilize robotic arms supporting pick up heads to pick up electronic components and automatically, rapidly and precisely position such components on a desired location on a printed circuit board (PCB) or a similar substrate. Such apparatus are generally known as pick and place systems.

Multiple "feeders" are generally provided for use with a pick and place system, each for supplying one of the various electronic components that are to be placed on a particular substrate. The feeders are typically positioned parallel to each other on the horizontal table on the pick and place system. The feeders may be removed and replaced, such as to mount a new reel of carrier tape, or when changing over the configuration of a pick and place system to support a different printed circuit board requiring a different set of components. Alternatively, multiple feeders may be collectively mounted on a movable rack, and may be replaced en masse with a rack supporting a different group of feeders.

The electronic components are commonly located in individual pockets on a polymeric or paper strip called "carrier tape" that is coiled on a supply reel rotatively supported on a feeder. The carrier tape includes sprocket holes on at least one longitudinal edge for advancing the carrier tape from the supply reel. Carrier tape also typically includes a removable cover tape that protects and secures the components within each pocket prior to use.

A feeder includes a mechanism to progressively advance the carrier tape to a pick up point to sequentially provide a single electronic component at a time for acquisition by a pick up head forming part of the pick and place system. The pick up head picks the component up and places it in position at a desired location on a printed circuit board. Most frequently, the pick up head includes a vacuum spindle that makes sealing contact with the electronic component to lift it up and carry it over to the substrate. Alternatively, mechanical grippers have been used to acquire an electronic component in place of a vacuum spindle.

The feeder progressively peels or cuts away the cover tape as the carrier tape is advanced to expose the electronic component to a pick and place head at the pick up point. Usually this is accomplished by detaching the leading end of the cover tape from the base tape. The free end of the cover tape is then engaged with and progressively pulled away from the base tape by a powered mechanism that maintains tension of the cover tape with a force greater than the adhesion force of the cover tape to the base tape. Typically, a stationary peeler overlies the cover tape adjacent to a pick up point and prevents the progressive detachment of the cover tape beyond the pick up point.

A movable shutter overlies the cover tape adjacent the peeler. The carrier tape is incrementally advanced to the pick up point by a separate powered mechanism, in response to a signal that the next incremental electronic component is needed by the pick up head. The carrier tape is advanced by a length sufficient to bring the next sequential individual electronic component to the pick up point. The shutter is then shifted in a direction to uncover the portion of the carrier tape that has been advanced with the single electronic component. Consequently, the portion of the carrier tape that has been advanced has its cover tape detached up to the peeler and removed by the powered mechanism. In some feeder designs, the shutter is eliminated entirely.

More recently pick and place systems have been devised that attempt to reduce the overall cycle time for populating a PCB with electronic components, by picking up multiple electronic components and then moving the group of components at the same time to the PCB for placement. These pick up heads include a plurality of vacuum spindles, each spindle to pick up a separate electronic component from one or more of the feeders. This approach recognizes that it is generally faster to pick multiple components and transport all of them as a group to the substrate to various desired locations, than it is to pick up, transport and place each electronic component separately.

However, this approach has encountered several difficulties that have limited its effectiveness. First, many pick up heads with multiple pick up spindles are capable of acquiring electronic components from a feeder at a rate faster than conventional feeders can advance each individual sequential electronic component of a particular type to a pick up point. This slows down the entire process while the pick up head is idle as the feeder is advancing.

The speed at which the feeder advances each sequential component is constrained by several factors. First, each time an electronic component is to be advanced, the entire mass of the supply reel and carrier tape wound thereupon and extending through the tape path must be accelerated, advanced and decelerated to a stop, all while the pick up head remains inactive and waiting for the component to arrive at the pick up point. Second, the electronic component within the pocket of the carrier tape is not secured therewithin, and therefore is not stable during this process. This requires additional waiting time at the pick up point for the electronic component to stabilize before the pick up spindle can acquire it reliably. Third, even if time is allowed for the electronic component to come to rest, the motion of detaching the cover tape and of moving the shutter may also introduce instability.

Finally, the electronic component may have an undesirable tendency to become stuck to the cover tape (such as by static electricity, moisture or surface energy) and removed from the pocket therewith or otherwise dislodged. All of these factors limit the degree to which the operation of conventional feeders may be accelerated.

An alternative approach would be to provide multiple feeders with the same component, so that the pick up head is able to acquire multiple units of the same electronic component by moving between multiple feeders as each feeder cycles forward after providing an electronic component. However, the linear space available for positioning feeders, and hence the number of feeders that may be utilized with a pick and place machine, is finite and limited for a given machine length. The complexity of components to be loaded on printed circuit boards is increasing, as is the number of components. In some cases, the size (width) of the components is also increasing. All of this places a premium on placement and maximum utilization of feeders, and increases the need to optimize the use of the feeders without limiting the speed that the pick up head operates at.

Thus, conventional feeders for pick and place machines, while having their own utility, do not adequately address the increasing speed of pick up heads relative to the speed at which the feeder advances each sequential individual electronic component into the pick up location.

SUMMARY OF THE INVENTION

The present invention provides a feeder for use with a pick and place machine having a pick up head with one or more pick up spindles. Each of the pick up spindles is for acquiring an electronic component from a pocket in a carrier tape with a base tape including a plurality of pockets, each for receipt of an electronic component. The carrier further includes a detachable cover tape over the electronic components in the pockets.

The feeder includes a housing having a longitudinal axis and an end proximate the pick up head and an opposing distal end, and a tape path extending therethrough for conveying the carrier tape to a pick up zone. The pick up zone being adapted to receive a length of the carrier tape with a plurality of electronic components therewithin for simultaneous presentation to the pick up head. Means are mounted on the housing adapted for advancing the carrier tape through the tape path to the pick up zone so that a plurality of the electronic components are simultaneously located within the pick up zone.

Means mounted on the housing adapted to incrementally remove the cover tape of the carrier tape in the pick up zone while the carrier tape is stationary to enable sequential acquisition of each uncovered electronic component in the pick up zone by one of the spindles of the pick up head.

In another embodiment of the present invention, two feeder mechanisms as described herein are mounted on the same housing, but operate independently of each other with two different carrier tapes.

The present invention further provides a method for providing electronic components seriatim supplied on a carrier tape having a base tape with a plurality of pockets, each for receipt of one of the electronic components, and a detachable cover tape for securing into a pick up zone for acquisition by a pick up head having one or more pick up spindles. The method of the present invention includes the steps of:

a) advancing the carrier tape along a tape path so that a plurality of electronic components are stationary and located within the pick up zone;

b) detaching and removing the cover tape over the pocket containing the leading component without moving the carrier tape;

c) lowering the first pick up spindle to acquire and remove the leading electronic component from its pocket;

d) detaching and removing the cover tape over the pocket containing the next sequential component without moving the carrier tape;

e) lowering the next pick up spindle to acquire and remove the exposed electronic component from its pocket; and f) repeating steps d) through e) to remove all of the electronic components located in the pick up zone in step a).

The method further includes the additional step of repeating steps a) through f) above to maintain a continuous supply of a plurality of the electronic components in the pick up zone.

BRIEF DESCRIPTION OF THE DRAWING

These and other features and objects of this invention will become clear from the following description, taken in conjunction with the preferred embodiments with reference to the accompanied drawings in which:

FIG. 2b is a magnified isometric view of the index wheel and ratchet wheel of FIG. 2a;

DETAILED DESCRIPTION OF THE DISCLOSURE

The present invention provides a tape feeder for dispensing electronic components from a carrier tape for use with automated electronic assembly equipment and a method for use therewith. The tape feeder simultaneously presents a plurality of electronic components in a pick up zone, and then incrementally removes the cover tape over the electronic components in the pick up zone for sequential acquisition by a pick up head. The term "electronic component" for the purposes of this invention, is to be interpreted broadly to at least include any object to be placed on a substrate by a pick and place machine, including but limited to, surface mount components, through hole components, flip chip devices, connectors, heat sinks and other odd form devices.

By moving a plurality of electronic components as a group, the average time required to advance the electronic components is reduced and the components are stabilized before encountering the pick up spindle. The process of progressively detaching the cover tape over the group of electronic components that have already been advanced into the pick up zone and stabilized requires substantially less time and force than the process required by conventional feeders of individually advancing the entire carrier tape and then either simultaneously or subsequently removing the cover tape. Waiting time for the pick up head is reduced and the overall speed for the pick and place system used with the feeder is improved.

Figure 1:
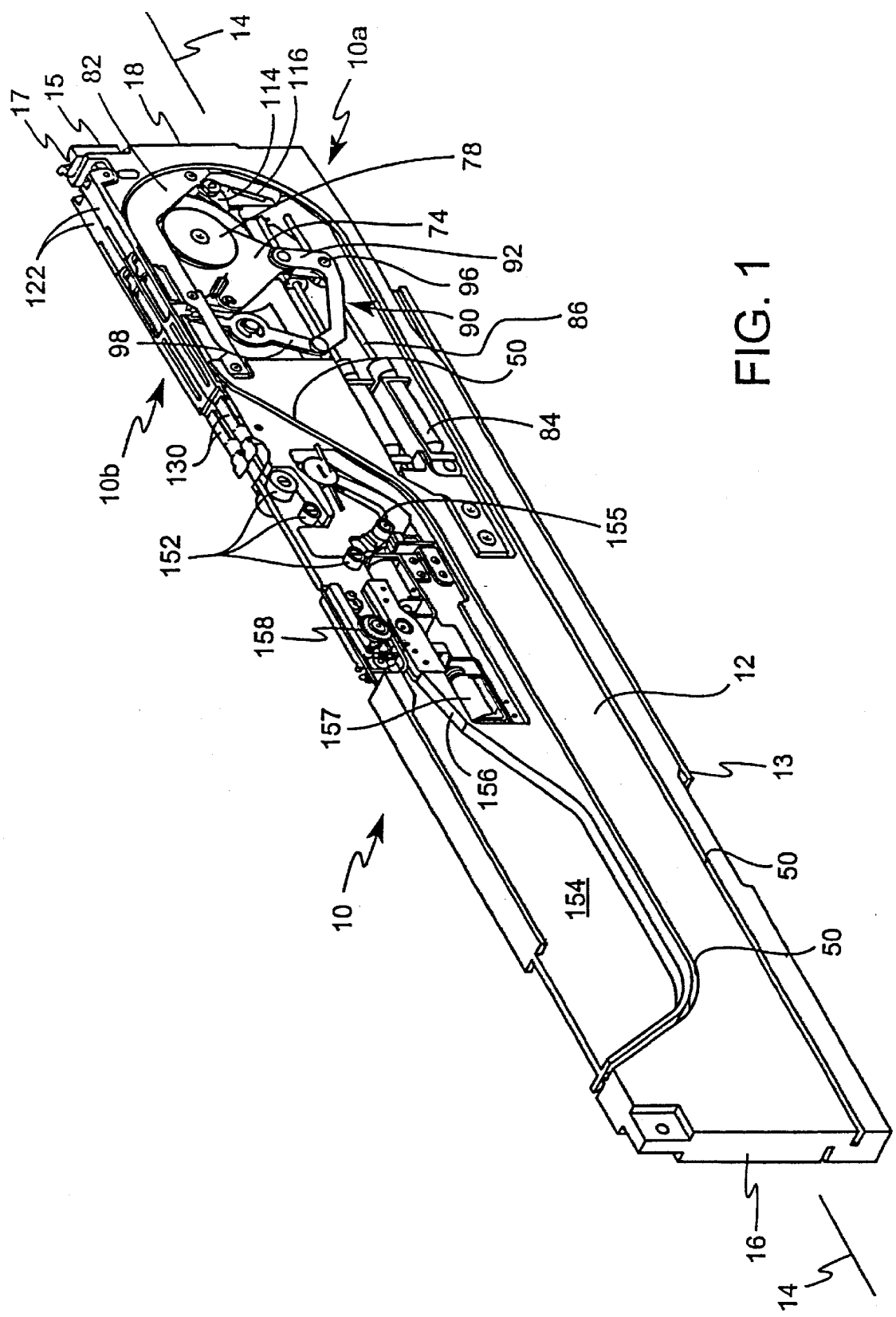
FIG. 1 is a partial isometric view of a portion of one embodiment of the feeder of the present invention having dual tape feeding mechanisms in the same housing.
Figure 2:
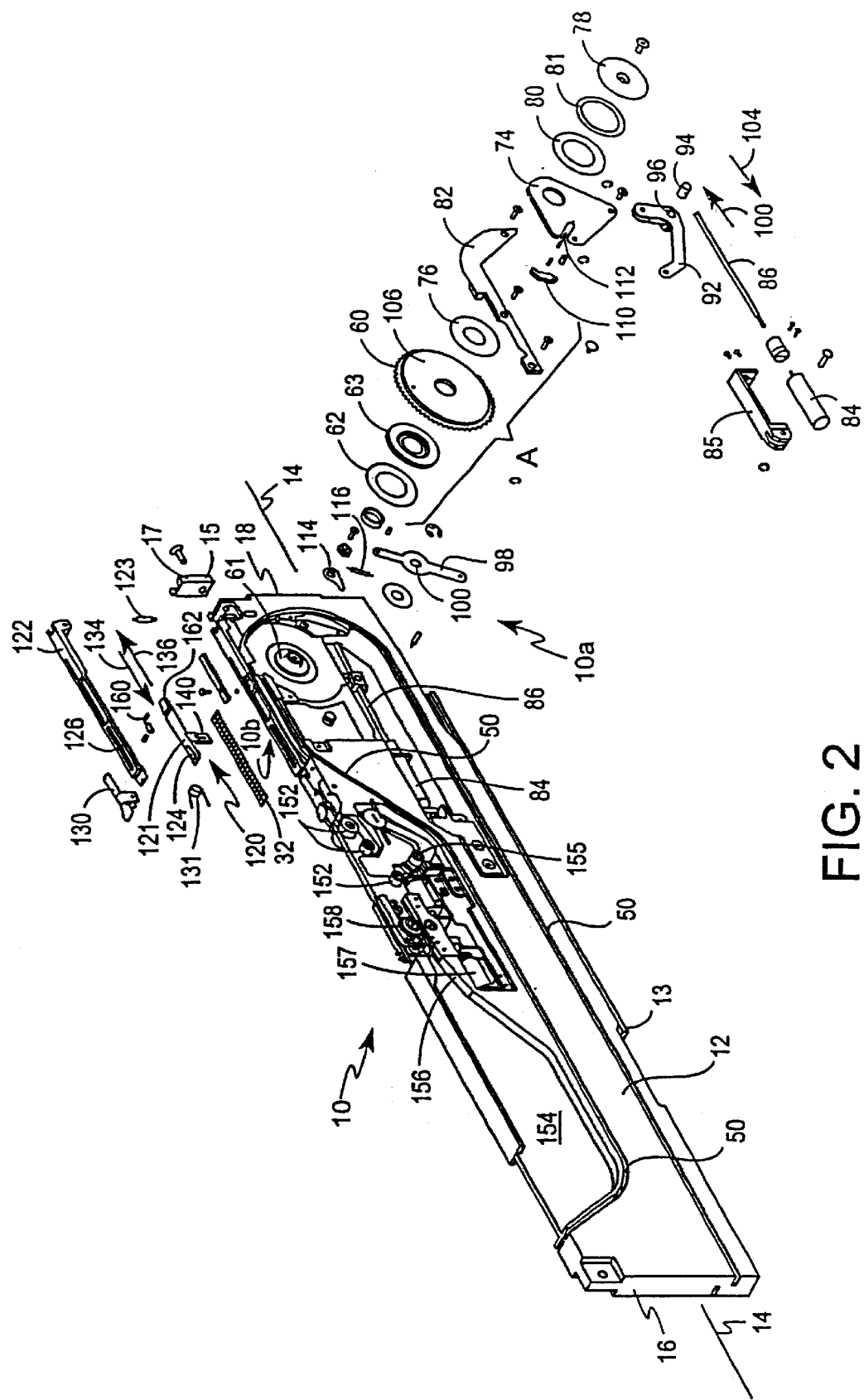
FIG. 2 is an exploded isometric view of the feeder of FIG. 1.
Figure 3:
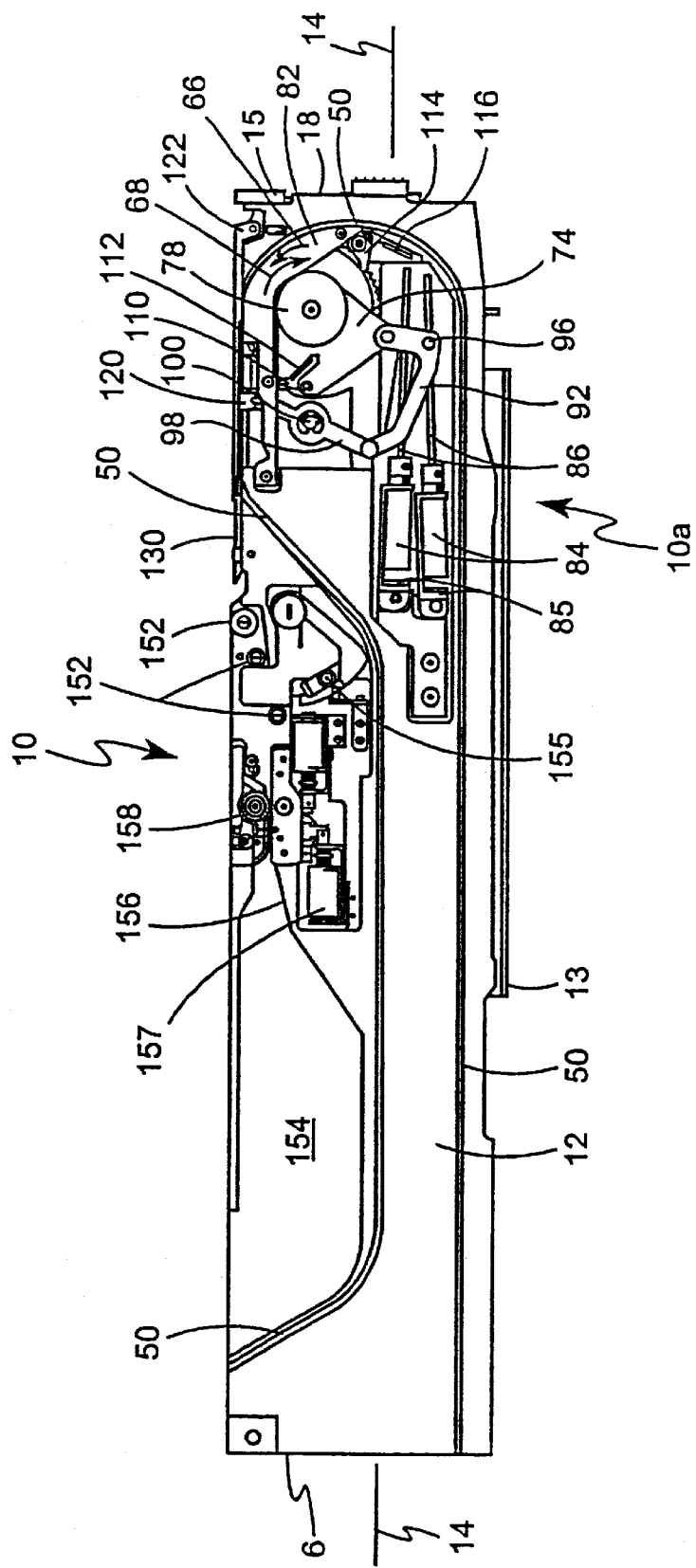
FIG. 3 is a side view of the feeder of FIG. 1 showing the tape path for the carrier tape and cover tape path.

Referring now to FIGS. 1–3, there is shown a feeder 10 according to the present invention. Typically, a plurality of feeders are used in conjunction with pick and place machines, each feeder to provide one of a variety of electronic components, as previously described herein. For instance, such pick and place machines for use with the feeder of the present invention are available from Universal Instruments Corporation of Binghamton, N.Y. under the trademark "GSM".

As will be explained in greater detail hereinafter, the feeder 10 of the present invention provides for multiple electronic components to be presented for rapid acquisition by a pick up head, such as for a pick and place machine, during a single trip to the feeder. Preferably, the feeder of the present invention is used in conjunction with a pick up head that has multiple spindles, each for acquiring, transporting and depositing an electronic component. For instance, such pick up heads having multiple (up to seven) spindles are available from Universal Instruments Corporation of Binghamton, N.Y. under the trademark "FlexJet".

Pick up heads having multiple spindles provide significant advantages over conventional pick up head designs in which the pick up head must make separate trips for each electronic component between the feeder and the substrate upon which the electronic components are to be deposited. Such substrates include, but are not limited to, printed circuit boards, flexible cables or any other object to which an electronic component could be mounted.

When pick up heads that have multiple pick up spindles, such as the FlexJet™ head, are used with conventional feeders, it has been found that the spindles on the pick up head can acquire the next sequential electronic component at a speed greater than the rate at which the feeder can advance the next electronic component to be acquired at the pick up point. Thus, the pick up head must remain idle as the feeder is advanced. This reduces the overall speed and efficiency of the pick and place machine. A conventional feeder, if used with a multiple spindle pick up head, might then become the limiting factor in the placement of the electronic components on the substrate.

Figure 4:
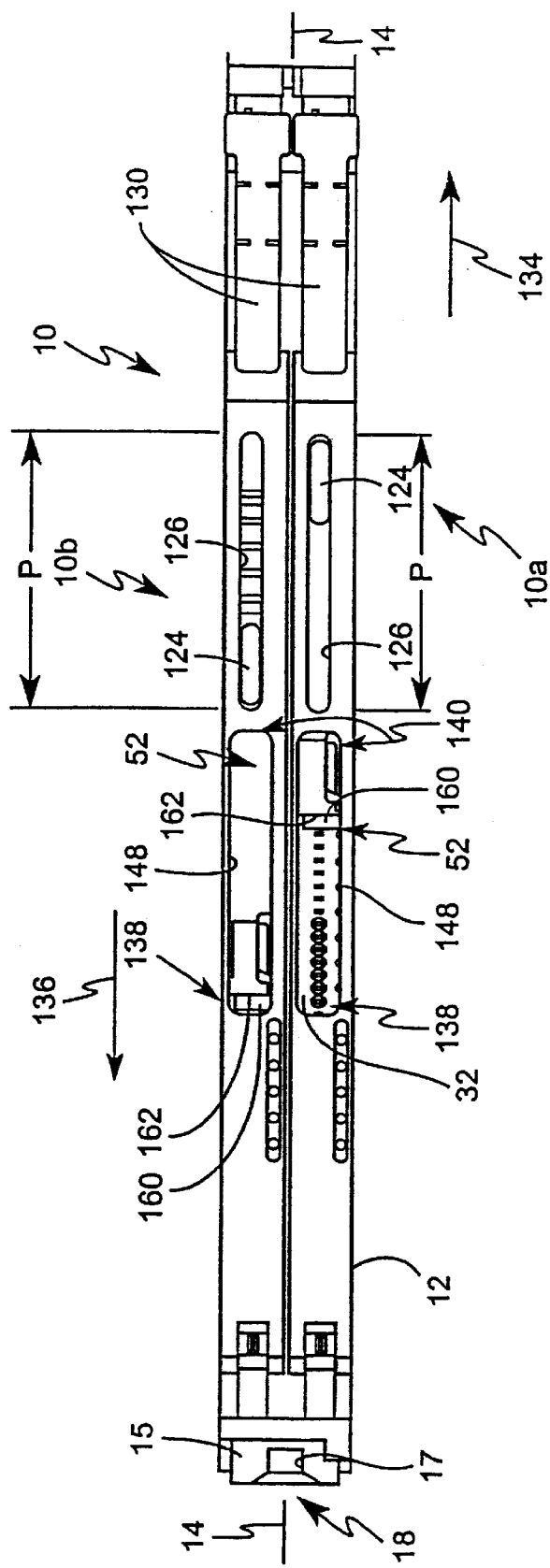
FIG. 4 is a top view of the feeder of FIG. 1, with one feeder mechanism in a home position and the second feeder mechanism in a fully exposed position.
Figure 5:
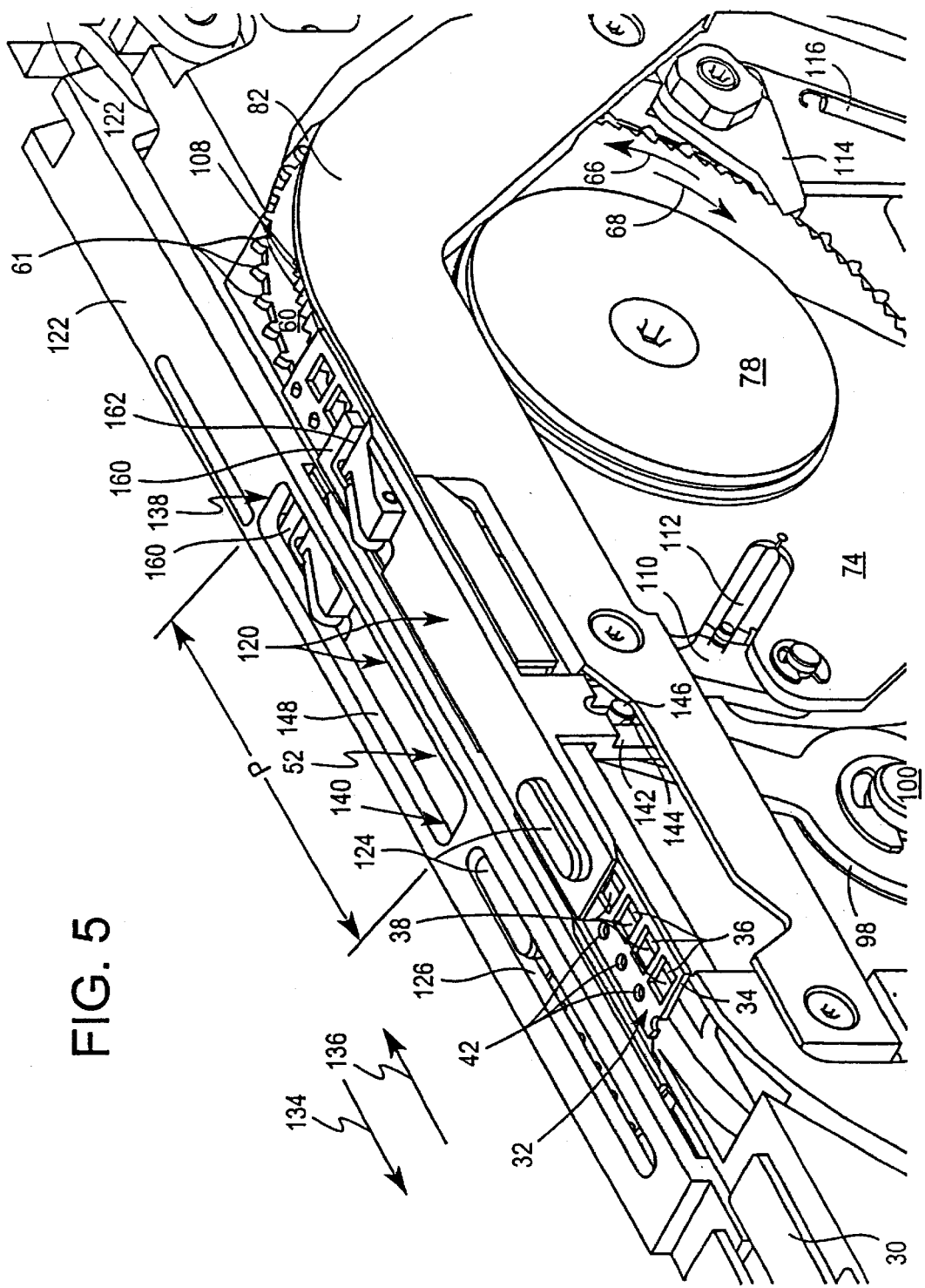
FIG. 5 is a magnified partial view of the pick up zones of both feeder mechanisms of FIG. 4.

Feeder 10 of the present invention includes a frame or housing 12 that defines a longitudinal axis 14 extending from distal end 16 to proximate end 18 relative to a pick up head (not shown) that acquires the electronic components (shown in FIG. 4) for placing on a substrate (not shown). The housing 12 may include a generally "T" shaped rail 13 extending along the bottom side thereof. This "T" shaped rail 13 is provided to slidingly engage a correspondingly "T" shaped slot (not shown) on a horizontal surface of the pick and place machine to support the feeder thereon. A row of the slots defines the number and potential locations for feeders to be used in conjunction with a particular pick and place machine.

Further, locator block 15 is mounted on the proximate end 18 of the housing and includes a slot or hole 17 or like feature for receiving and engaging an aligned stabilizing pin (not shown) or like feature provided on the GSM brand pick and place machine. The inter-engagement of the stabilizing pin and the locator block 15 maintains the feeder in an upright position during use.

In the illustrated embodiment, housing 12 supports two parallel, independent feeder mechanisms 10a, 10b each mounted on opposing longitudinal sides of the housing 12. It will be appreciated that a feeder according to the present invention could be provided having a single feeder mechanism on housing 12, substantially as hereinafter described. The feeder mechanisms 10a, 10b are substantially equivalent in structure and operation. For convenience, common reference to both feeder mechanisms 10a, 10b hereinafter will utilize common reference numerals and will be deemed to apply equally to both mechanisms shown in FIG. 1, unless specifically noted to the contrary. It will also be understood that although the feeder mechanisms 10a, 10b are functionally equivalent, each may be adapted for use with a different width of carrier tape, or for use with a different electronic component.

Figure 2A:
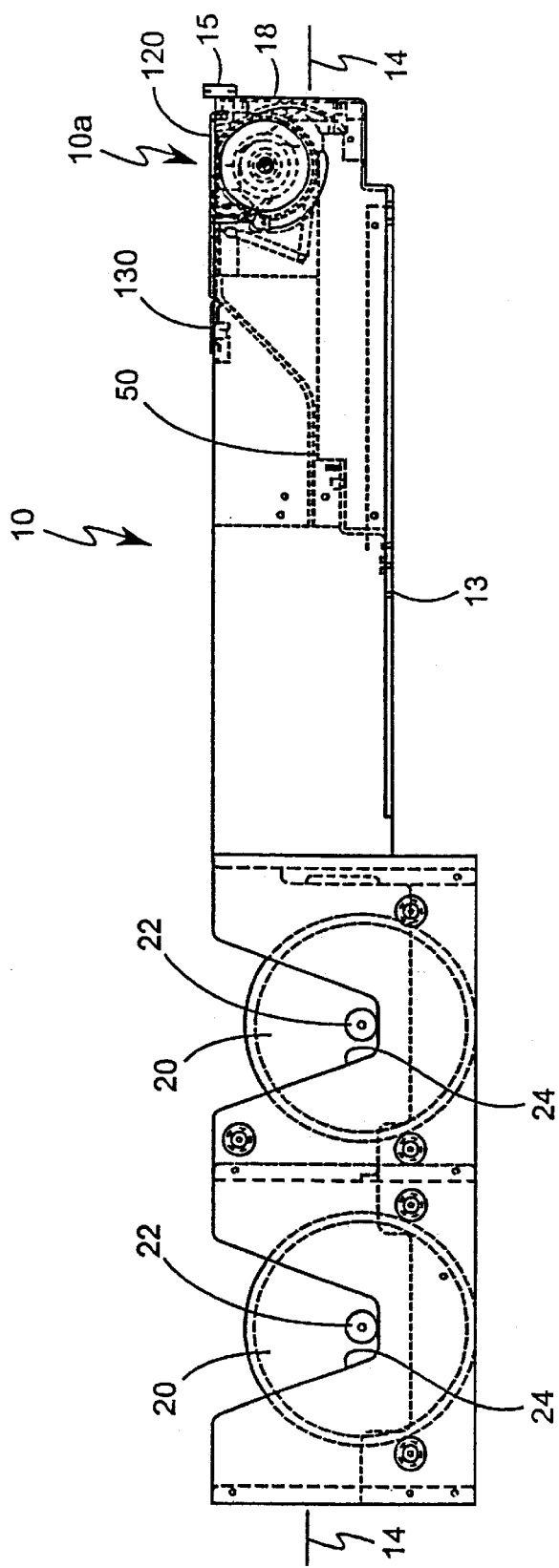
FIG. 2a is a side view of the feeder of FIGS. 1 and 2 with a pair of longitudinally aligned supply reels.

For each feeder mechanism 10, a supply reel 20 (Shown more particularly in FIG. 2a) is rotatively mounted on the housing 12, such as by hub 22 rotatively residing in a slot 24 of the housing 12. In order to minimize width of the feeder 10, the slots 24 may be longitudinally aligned, rather than laterally spaced, as shown. A length of a carrier tape 32 is wound upon each supply reel 20.

Figure 6:
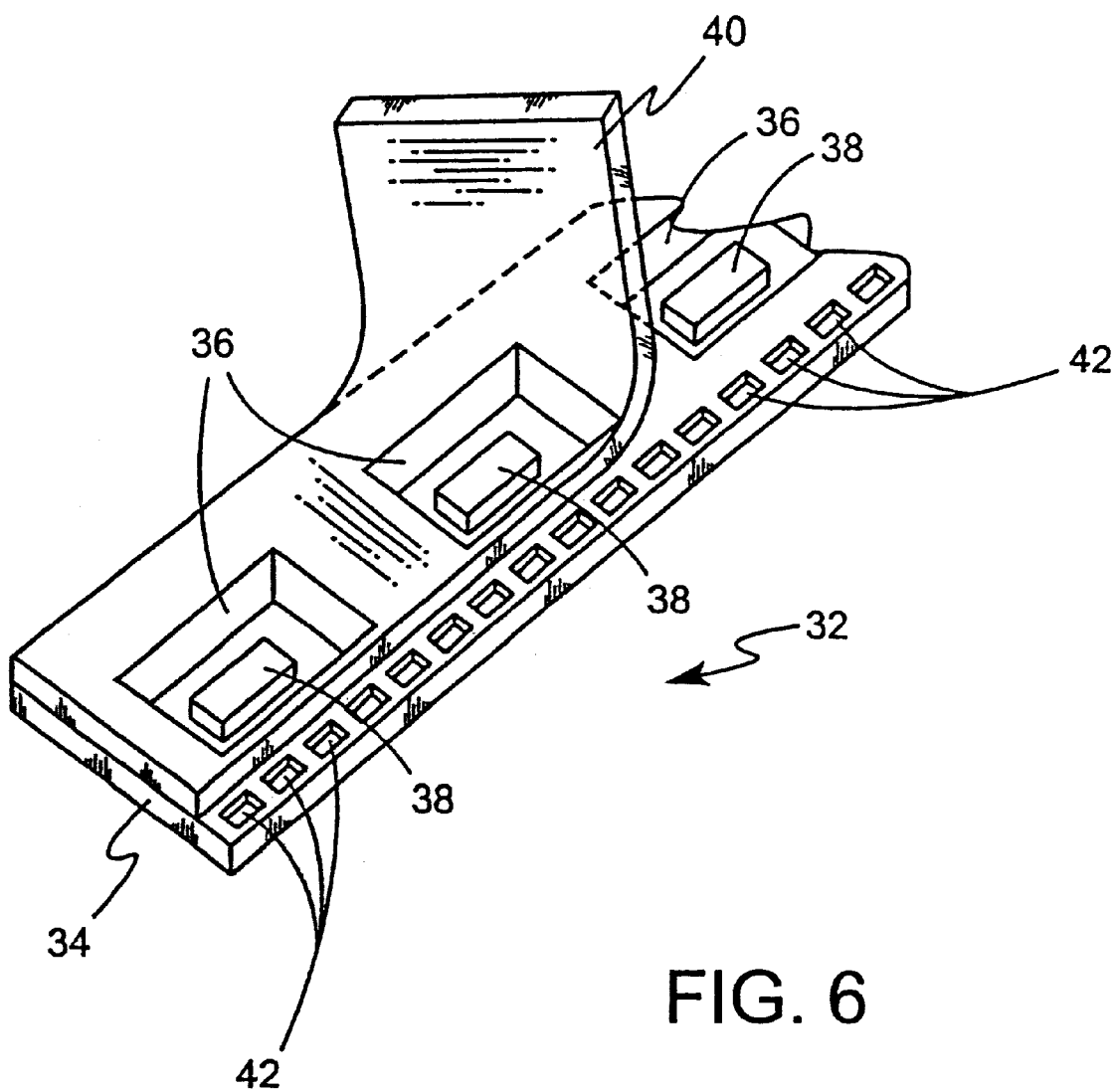
FIG. 6 is an isometric view of a portion of exemplar carrier tape with the cover tape partially detached therefrom.

As shown more particularly in FIG. 6, carrier tape 32 includes base tape 34 having a plurality of pockets 36, each containing an electronic component 38. Cover tape 40 is removably adhered to the carrier tape in a manner known in the art to retain and protect the electronic component in the pocket 36 until use. A row of sprocket holes 42 is formed along at least one longitudinal edge of the carrier tape, as is known in the art. Typical widths for carrier tape include 8, 12, 16, 24, 32, 44, 56 and 88 mm, depending on the size and width of the component to be dispensed.

Tape path 50 extends through housing 12 to convey the carrier tape 32 from the supply reel 20 through the feeder 10 generally from the distal end to reach a pick up zone 52 located generally at the proximate end. To minimize the width of overall mechanism, the tape paths for each feeder mechanism are vertically offset as the respective tape paths extend through the housing.

Means are provided to advance the carrier tape along the tape path 50. In the illustrated embodiment of the invention, the means for advancing the tape includes an index wheel 60 rotatively mounted on hub or bushing 61 mounted on the housing 12, so that at least a portion of the periphery of the index wheel encounters the tape path 50. Thrust washer 62 and thrust bearing 63 are interposed between the index wheel and the housing to facilitate free rotation of the index wheel relative thereto. The periphery of the index wheel 60 includes radially projecting teeth 64 pitched for engagement with the sprocket holes 42 on the carrier tape. Rotation of the index wheel in direction 66 will advance the carrier tape in direction 70 along the tape path 50.

Pawl plate 74 is rotatively mounted on the housing at a common axis of rotation as index wheel 60 but is not directly connected thereto, so that both the index wheel and the pawl plate rotate independently of each other. A spacer wheel 76 constructed of a low friction material such as nylon or the like, is interposed between the pawl plate 74 and the ratchet wheel/index wheel about hub 61, to facilitate free rotation therebetween.

A retainer plate 78 may be mounted outside of the pawl plate to protect and retain all of the index wheel, pawl plate and linkage assembly relative to the housing, with a thrust washer 80 and wave spring washer 81 interposed between the retainer plate and the pawl plate. The wave spring washer 81 acts to resiliently urge all of the components rotatively mounted on hub 61 towards the housing. Tape support 82 is mounted on the housing so that a portion of the periphery thereof forms a part of the tape path.

The mechanism to induce rotation of the index wheel 60 in direction 66 includes actuator 84, such as a motor, solenoid, pneumatic or hydraulic piston, or equivalent device. Actuator 84 in the illustrated embodiment is a rotary motor connected to lead screw 86, and rotates the lead screw in opposing rotational directions responsive to appropriate control signals. In any of the embodiments of the present invention, power may be stored on the feeder 10 and supplied as needed, such as by an electric battery, or the feeders may be connected to an external power source. Most conveniently, this may be done by connections through the pick and place machine to which the feeder is mounted, such as through electrical contacts, or pneumatic or hydraulic connections (not shown) in the proximate end 18 of the housing that are presented for engagement with like features on the pick and place machine.

The lead screw is operatively connected to the pawl plate 74 through linkage assembly 90. Linkage assembly 90 includes first linkage arm or crank arm 92. The lead screw 86 is threadedly engaged with nut 94 pivotally mounted on the first linkage arm 92 at an intermediate point 96. One end of the first linkage arm 92 is connected to pawl plate 74 as shown in FIG. 2. The other end of the first linkage arm 92 is connected to one end of second linkage arm 98. The second linkage arm 98 is pivotally mounted on the housing 12 at an intermediate point 100.

Thus, in the illustrated arrangement, rotation of the lead screw 86 in one direction moves nut 94 away from the actuator in direction 102, thereby inducing rotation of the pawl plate 74 in rotational direction 68. Conversely, rotation of the lead screw in the opposite rotational direction moves nut 94 back towards the actuator in direction 104, thereby inducing rotation of the pawl plate in opposite direction 66. The actuator 84 should preferably need to pivot relative to the housing to accommodate the movement of the linkage assembly 90 and lead screw 86. An alternative to pivotally mounting the actuator directly to the housing is to pivotally mount the actuator to mounting block 85. Mounting block 85 is mounted on housing 12.

Figure 2B:
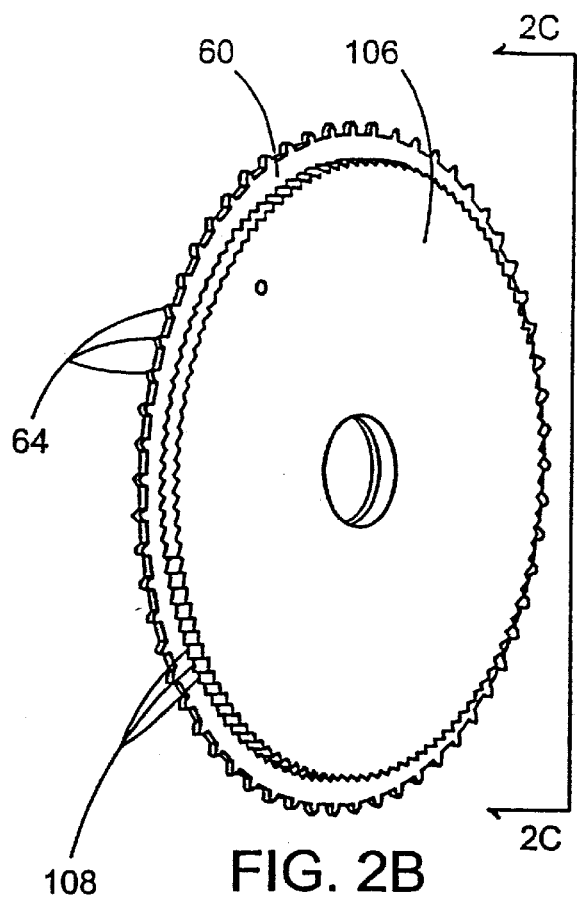
Figure 2C:
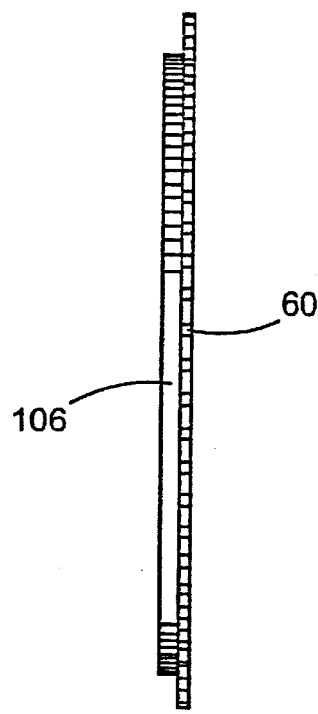
FIG. 2c is a side view along plane 2c—2c of the index wheel and ratchet wheel of FIG. 2b.
Figure 2D:
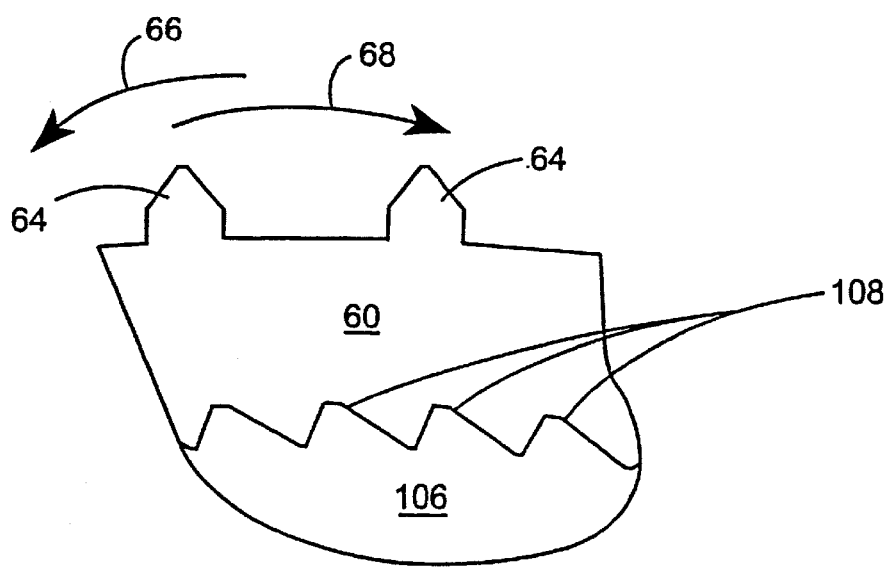
FIG. 2d is a magnified partial view of the teeth of the index wheel and ratchet wheel of FIGS. 2b and 2c.

The carrier tape advancement means further includes ratchet wheel 106 mounted on index wheel 60 and connected or even formed unitarily with the index wheel (as shown more particularly in FIGS. 2a and 2b) so that the ratchet wheel and the index wheel rotate in unison. The ratchet wheel 106 is of smaller diameter than the diameter of the index wheel to not intrude on the tape path 50 for the carrier tape. Ratchet wheel 106 includes a plurality of asymmetrical teeth 108 along its periphery (see FIG. 2d) oriented backwardly in rotational direction 68.

Pawl 110 is rotatively mounted on pawl plate 74 and is biased by spring 112 connected at one end to the pawl 110 and the other to pawl plate 74 so as to resiliently bias the pawl into engagement with the teeth 108 of the ratchet wheel 106. In this fashion, when the pawl plate rotates in direction 68, the pawl slides over the asymmetrical teeth 108 of the index wheel, and consequently the index wheel and ratchet wheel do not move. When the pawl plate is rotated in opposite rotational direction 66, the pawl 110 engages the teeth 108 and consequently, the pawl plate and index wheel move in unison in direction 66.

Means are provided to prevent rotation of the index wheel in opposing direction 68 to ensure that the carrier tape only advances in direction 70, regardless of the movement of the index wheel. In the illustrated embodiment of the present invention, the rotation prevention means includes second pawl 114 pivotally mounted on housing 12 and resiliently biased by spring 116 into engagement with teeth 108 of the ratchet wheel 106. Since the teeth 108 are asymmetrical as previously described, the second pawl 114 will engage the teeth 108 to preclude movement of the index wheel in direction 68.

Means are also provided to progressively remove and dispose of the cover tape to expose the electronic components in the various pockets to the pick up head in the pick up zone 52. In the illustrated embodiment, the cover tape removing means includes shutter/peeler assembly 120. The shutter/peeler assembly 120 is captured by carrier tape retaining latch 122 against housing 12, such as by tab 124 on the shutter/peeler assembly 120 that engages slot 126 in the tape retaining latch 122. The tape retaining latch 122 is located on the upper side of the housing 12 and resiliently biased toward the housing, such as by a spring 123, interposed between the housing and the tape retaining latch.

The tape retaining latch 122 is retained in a position adjacent to the housing by clasp 130 pivotally mounted on the housing and resiliently biased, such as by a spring 131 in a rotational direction towards housing 12, so that the clasp 130 engages the end of the tape retaining latch 122 and also resiliently urges it towards the housing as shown. In this position, the tape retaining latch actually forms part of the tape path 50 to guide the carrier tape to the pick up zone. Since the tape retaining latch 122 is resiliently supported on the housing as described herein, it is able to "float" or accommodate variations in the thickness of the carrier tape (frequently encountered) as the tape passes through the feeder.

Shutter/peeler assembly 120 is provided to control the delamination of the cover tape from the base tape of the carder tape, generally corresponding to the shutter found on many conventional feeders. However, whereas the peeler on conventional feeder designs is stationary or possibly advances only by one component length, the shutter/peeler assembly 120 of the present invention is shiftable along the upper edge of the housing opposing reciprocal directions 134 and 136 by a length that encompasses one, or alternatively multiple electronic components at one time. As shown more particularly in FIG. 4, the shutter/peeler assembly is shiftable between a home position as at 138 for one of the feeder mechanisms in FIG. 4 disposed towards proximate end 18 of the housing, and a fully exposed position as at 140 disposed towards distal end 16 of the housing 12.

The linkage assembly 90 actuates movement of the shutter/peeler assembly 120 between its home and fully exposed positions. Shutter/peeler assembly 120 also includes downwardly depending flange 142 that includes slot 144. Laterally extending pin 146 adjacent the second end of the second linkage arm 98 slidingly engages the slot 144. In this manner, extension of the nut 94 by rotation of the lead screw 86 of the actuator 84 induces rotation of pawl plate 74 in rotational direction 68, inducing the linkage assembly 90 to shift the shutter/peeler assembly 120 from its home position 138 to its fully exposed position 140 in direction 134.

The shutter/peeler assembly 120 reciprocates between its home position 138 and fully exposed position 140 along the length "P" of the portion of the feeder 10 defined as the pick up zone 52. The pick up zone 52 is the location from which the electronic components may be acquired by a pick up head (not shown) for placement on a substrate (not shown), as previously described herein. In the illustrated embodiment, the boundaries of the pick up zone are defined by the pick up window 148 in the tape-retaining latch 122. It is intended that the length "P" of the pick up zone is sufficient to simultaneously accommodate at least two electronic components 38 in their respective pockets 36 within the pick up zone. Preferably, the length "P" is selected so that the number of electronic components 38 simultaneously presented for acquisition within the pick up zone is equal to the number of spindles (not shown) on the pick up head.

The free end of the cover tape 40 is detached from the base tape 34 and led through window 148 of the tape retaining latch 122 and thereupon along a cover tape disposal path 150 past one or more idler rollers 152 and along flange 156 to a disposal chamber 154 in the housing. Tension is maintained on the cover tape 40 by tension roller 155 mounted on tension arm in a manner known in the art. When required, drive wheel 158 engages the cover tape and is actuated by solenoid 157 or like device (alternatively, a separate powered take up reel, not shown) that exerts a force greater than the adhesion force of the cover tape to the base tape to detach additional lengths of the cover tape and advance the cover tape into disposal chamber 154.

Figure 2F:
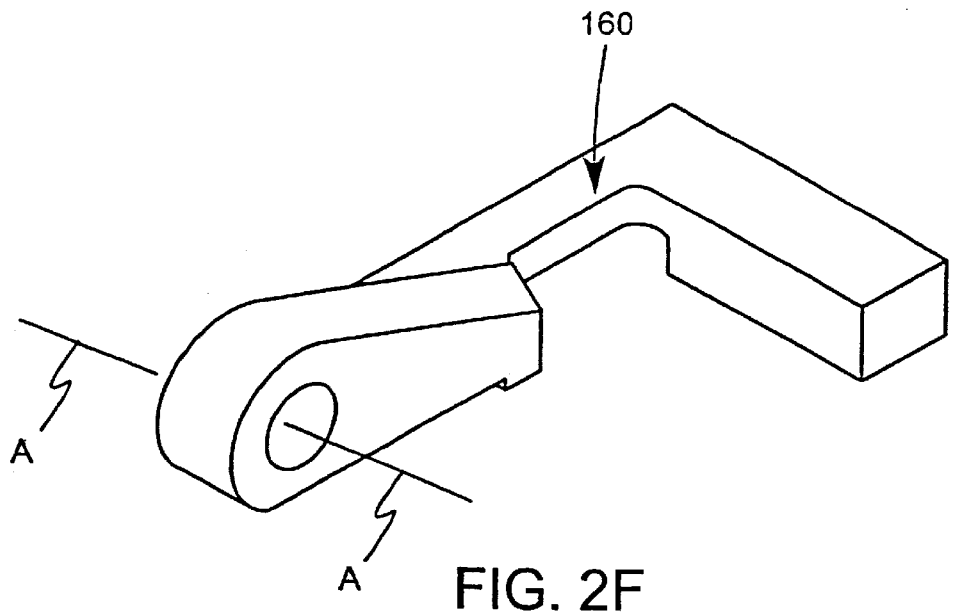
FIG. 2f is a magnified isometric view of the shutter of the feeder of FIG. 1 for use with the peeler of FIG. 2e.
Figure 2E:
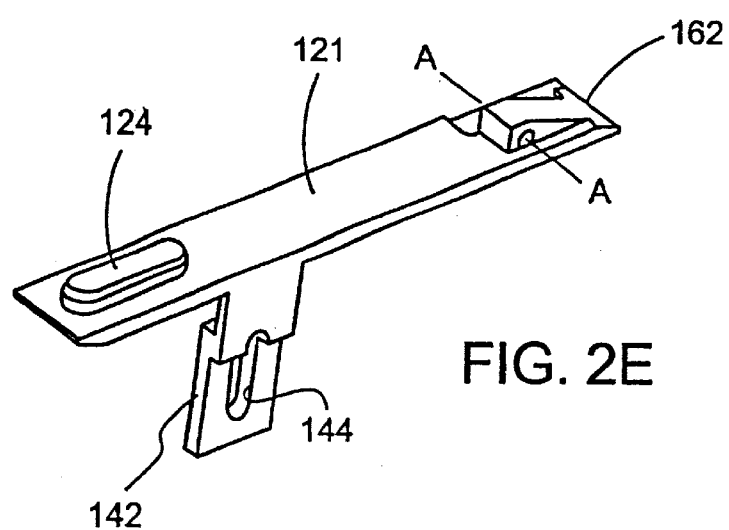
FIG. 2e is a magnified isometric view of the peeler of the feeder of FIG. 1.

The shutter/peeler assembly 120 controls propagation of detachment of the cover tape. The shutter/peeler assembly includes peeler 121 (shown more particularly in FIG. 2e) and shutter 160 (shown more particularly in FIG. 2f) pivotally mounted on one end of the peeler 121. The shutter 160 may be conveniently rotated away from the tape path when initially extending the free end of the detached cover tape 40 along its tape path 150 to the disposal chamber 154. The shutter 160 may then be rotated (or resiliently biased) back to a position adjacent to the tape path 50 during use of the feeder. The leading edge 162 of the peeler 121 may be formed in a manner to provide a sharp change in direction for the cover tape relative to the tape path 50, facilitating the detachment of the cover tape from the base tape.

The feeder 10 of the present invention is designed so that the shutter/peeler assembly 120 is capable of progressively uncovering a plurality of the electronic components in the pick up zone. Preferably, in use, the carrier tape 32 is advanced as previously described, to position a plurality of electronic components 38 within their respective pockets and enclosed by cover tape, within the pick up zone 52 and with the shutter/peeler assembly in its home position and no electronic components exposed in the carrier tape. This is most conveniently accomplished during the time period when the pick up head is traveling to the substrate to place electronic components thereon, is traveling back to the feeders to acquire more electronic components, or the pick up head is occupied at another feeder on the pick and place machine. The carrier tape is then stationary, and the electronic components therewithin stabilized.

When thus ready, a pick up head may be located just above the pick up zone 52. In contrast to conventional feeder designs having a stationary peeler, in the present invention the shutter/peeler assembly 120 is shifted away from the home position 138 by a distance sufficient to detach and remove the cover tape over the first electronic component adjacent to the home position. One of the spindles on the pick up head is lowered to acquire that component and remove it from the first pocket 36 in a manner known in the art. Once the spindle is retracted from the pocket, the feeder is actuated to shift the shutter/peeler assembly away from the home position by a distance sufficient to uncover the second component in the same manner described in regard to the first component. The shifting of the shutter/peeler assembly may be responsive, for instance, to a signal from the pick up head that it has lifted the first spindle to a predetermined "safe height" above the carrier tape. The pick up head then lowers a second spindle to acquire the second component. The feeder than progresses to the third component, fourth component and so on (if needed), until the shutter/peeler assembly has traveled the distance "P" in the pick up zone and reached its fully exposed position 140.

During all of this incremental movement of the shutter/peeler assembly in direction 134 and pawl plate in rotational direction 68, the index wheel 60 and carrier tape are stationary. However, when it is desired to return the shutter/peeler assembly to its home position 138 in direction 136, pawl plate 74 rotates in direction 66, along with index wheel 60 and ratchet wheel 106, preferably in one continuous movement. Thus, as the shutter/peeler assembly achieves its home position, the carrier tape is advanced in direction 70 by the index wheel to present a new section of the carrier tape containing a plurality of electronic components. It will be understood that the tension roller 155 accommodates the movement of the cover tape in direction 136 as well, but acts to maintain tension on the cover tape regardless of the position of the shutter peeler assembly within the pick up zone. It will also be understood that the movement of the shutter peeler assembly actually requires the disposal of a double length of the cover tape. The cycle can thus be repeated as previously described. The base tape that has been emptied of electronic components continues along the tape path 50 exteriorly of the feeder 10 for subsequent disposal, as is known in the art.

Further, the illustrated embodiment of the present invention also provides a feeder design that is capable of minimizing the width of the feeder. For instance, the actuators 84 for each of the feeder mechanisms 10a and 10b are illustrated as being generally vertically spaced, rather than laterally spaced. Thus, the respective lead screws 86 for each actuator 84 are likewise generally vertically spaced, but inclined at different angles to rotatively engage the corresponding nuts 94. Another feature of the preferred embodiment is to vertically offset the respective tape paths 50 for each feeder mechanism 10a, 10b, as shown in FIG. 1. This minimization of width is a significant advantage of the feeder of the present invention over conventional feeder designs in that it increases the number of feeders available for use with a particular pick and place machine at any given time. However, it will be understood that the features and advantages of the present invention are available as described herein, regardless of the width of the feeder.

It will be understood that in the illustrated embodiment having two feeder mechanisms supported on a common housing, that although the feeder mechanisms 10a and 10b are substantially identical in operation and utilize substantially the same components, they are not mirror images of each other in that they are typically assembled in a different arrangement. That is, the sequence of components assembled to hub 61 for feeder mechanism 10a (as shown in FIGS. 1–3 and 5) is slightly different than the sequence of assembling the same components for feeder mechanism 10b (not shown). This is due to the fact that most carrier tapes only have sprocket holes along one longitudinal edge, not both. However, both carrier tapes being fed through feeder 10 must be oriented that same way. To properly position the index wheel for feeder mechanism 10b to be aligned with the sprocket holes, the sequence of parts identified as "A" in FIG. 2 is assembled in the same order as shown, but with the pawl plate 74 closest or innermost to the housing 12, and the retainer plate 78 farthest from the housing. The thrust washer 62, and tape plate 82 are omitted from feeder mechanism 10b.

It will be understood that each feeder mechanism 10a, 10b may be employed to dispense different electronic components. Further, it may be desirable to construct the feeder mechanisms with pick up zones that present a different number of electronic components for acquisition, depending, for instance, on the relative frequency that a particular component is to be acquired and dispensed onto a substrate. This may be accomplished, for instance, by designing the length of the pick up zone 52/window 148, the pitch of the teeth 108 of the index wheel 60 and sprocket holes 42 of the carrier tape in relation to the size and spacing of the electronic components in the carrier tape so that the number of components in the pick up zone corresponds to the number of pick up spindles in the pick up head.

Many modifications and variations of the present invention are possible in light of the above teachings. It is therefore to be understood that within the scope of the appended claims, the invention may be practiced other than as specifically described.

For instance, any suitable alternative mechanism may be employed to induce rotational movement of the index wheel other than the one illustrated. For instance, a rotary actuator (not shown) such as an electric motor may be directly attached to the hub 61. However, it is desirable in constructing feeders to minimize the width of the feeders, as the space available to receive the feeders on a pick and place machine is generally restricted. Another alternative embodiment would be to provide teeth (not shown) on the periphery of the pawl plate and provide a worm gear mounted on a rotatable shaft connected to the actuator. The actuator is rotated and the worm gear translates the rotation of the actuator into rotation of the pawl plate. Another alternative is to provide a reciprocally moving shaft (not shown) powered by a linear actuator and connected directly to the pawl plate 74. Extension and retraction of the shaft will induce rotation of the pawl plate in the opposing rotational directions previously described, as desired.

What is claimed is:

1. A feeder for use with a pick and place machine having a pick up head with at least one pick up spindle for acquiring an electronic component from a carrier tape, the feeder comprising:

a housing having a longitudinal axis, an end proximate the pick up head, an opposing distal end, and a tape path for advancing the carrier tape to a pick up zone;

said pick up zone defining a region in which components in the carrier tape are acquired by the pick up head;

said pick up zone being adapted to receive a length of the carrier tape with a plurality of electronic components therewithin;

a tape drive mounted on said housing for advancing the carrier tape through said tape path to said pick up zone so that a plurality of the electronic components are simultaneously located within said pick up zone; and a shutter mounted on said housing adapted to incrementally remove a cover tape of the carrier tape in said pick up zone to enable sequential acquisition of each uncovered electronic component in said pick up zone by one of the spindles of the pick up head.

2. The feeder of claim 1, wherein the carrier tape includes a base tape having the plurality of pockets and a detachable cover tape over the electronic components in the pockets, wherein the shutter mounted on said housing incrementally removes the cover tape of the carrier tape in said pick up zone while the carrier tape is stationary to enable sequential acquisition of each uncovered electronic component in said pick up zone by the spindle of the picks up head.

3. The feeder of claim 2, wherein said shutter includes a shutter/peeler assembly slidable along said tape path with respect to said housing between a home position nearer to said proximate end and a fully exposed position nearer to said distal end, wherein said pick up zone is located between said home position and said fully exposed position of said shutter/peeler assembly, said shutter/peeler assembly adapted to being interposed between the cover tape and the base tape of the carrier tape, thereby incrementally detaching the cover tape from the base tape as the shutter/peeler assembly shifts towards its fully exposed position and the carrier tape is stationary to expose the electronic components to the pick up head.

4. The feeder of claim 3, wherein said tape drive includes:

an index wheel rotatively mounted on the housing and adapted for engagement with the carrier tape; and a rotater to rotate said index wheel to advance the carrier tape towards said pick up zone.

5. The feeder of claim 4, wherein the shutter includes a device for shifting said shutter/peeler assembly from said home position towards said fully exposed position with said index wheel stationary, and for shifting said shutter/peeler assembly back to said home position in one continuous movement in conjunction with said index wheel advancing the carrier tape into said pick up zone.

6. The feeder of claim 1, wherein the tape drive advances the carrier tape through said tape path to said pick up zone so that the plurality of the electronic components are simultaneously located within said pick up zone in one motion.

7. The feeder of claim 1, wherein the shutter removes the cover tape while the carrier tape is stationary.

8. A feeder for use with a pick and place machine having a pick up head with at least one pick up spindle for acquiring an electronic component from a pocket in a carrier tape with a base tape including a plurality of pockets for receipt of an electronic component and further including detachable cover tape over the electronic components in the pockets, the feeder comprising:

a housing having a longitudinal axis and an end proximate the pick up head and an opposing distal end, and a first tape path extending therethrough for conveying a first carrier tape to a first pick up zone, and a second tape path extending therethrough for conveying a second carrier tape to a second pick up zone;

each of said first and second pick up zones being adapted to receive a length of a respective one of the first and second carrier tapes with a plurality of electronic components there within for presentation to the pick up head;

a tape drive mounted on said housing adapted for independently advancing each of the first and second carrier tapes through said first and second tape paths to said first and second pick up zones so that a plurality of the electronic components are simultaneously located within each of said pick up zones; and a shutter mounted on said housing adapted to independently and incrementally remove the cover tape of each of the carrier tapes in said first and second pick up zones while each carrier tape is stationary to enable sequential acquisition of each uncovered electronic component in said pick up zones by one of the spindles of the pick up head.

9. A method for providing electronic components seriatim supplied on a carrier tape having a base tape with a plurality of pockets, each pocket for receipt of one of the electronic components, and a detachable cover tape for securing the components in the pockets, into a pick up zone for acquisition by a pick up head, the method comprising the steps of:

a) advancing the carrier tape along a tape path so that a plurality of electronic components are stationary and located within the pick up zone;

b) detaching and removing the cover tape over the pocket containing the leading component without moving the carrier tape;

c) lowering the pick up head to acquire and remove the leading electronic component from its pocket;

d) detaching and removing the cover tape over the pocket containing the next sequential component without moving the carrier tape;

e) lowering the pick up head to acquire and remove the next sequential exposed electronic component from its pocket; and f) repeating steps d) through e) to remove all of the electronic components located in the pick up zone in step a).

10. The method of claim 9, further including repeating steps a) through F).

11. The method of claim 10, further including step g) after step f) and prior to repeating step a) of sliding the shutter/peeler assembly along the tape path in the direction that the carrier tape is advanced from the fully exposed position back to the home position.

12. The method of claim 9, wherein step b) includes the steps of:

interposing a shutter/peeler assembly between the base tape and the cover tape at a leading edge of the carrier tape in the pick up zone;

sliding the shutter/peeler assembly from a home position at the leading edge of the carrier tape along the tape path in a direction opposite that which the carrier tape is advanced to progressively detach the cover tape from the base tape.

13. The method of claim 7, wherein:

step d) includes the step of sliding the shutter/peeler assembly further along the tape path in a direction opposite that which the carrier tape is advanced to progressively detach the cover tape from the base tape over each sequential pocket; and wherein in step f), the shutter/peeler assemble achieves a fully exposed position with the cover tape removed from all of the pockets in the carrier tape located in the pick up zone.

14. The method of claim 9, wherein the pick up head includes a plurality of pick up spindles, and wherein step c) uses a first of the spindles, and step e) uses another of the spindles.

15. A feeder for use with a pick and place machine having a pick up head for acquiring an electronic component from a pocket in a carrier tape including a plurality of pockets for receipt of an electronic component, the feeder comprising:

a housing having a tape path for conveying the carrier tape to a pick up zone;

said pick up zone defining a region in which electronic components in the carrier tape may be acquired by the pick up head, said pick up zone adapted to receive a length of the carrier tape having a plurality of electronic components therewithin;

a multi-stage shutter mounted on said housing to cover components in the carrier tape that are in the pick up zone, the shutter being movable in increments, wherein each incremental movement of the shutter exposes another one of the plurality of components in the pick up zone; and a tape drive mounted on said housing for advancing the carrier tape through said tape path to said pick up zone so that a plurality of the electronic components are simultaneously located within said pick up zone.

16. The feeder of claim 15, wherein the carrier tape includes a base tape and a cover tape, and the shutter removes the cover tape from the base tape as the shutter moves incrementally.

17. A method of feeding electronic components in a pick and place machine having a pick up head for acquiring electronic components from a carrier tape having electronic components thereon, the method comprising the steps of:

advancing the carrier tape to a pick up zone so that a first plurality of the electronic components are simultaneously located within said pick up zone;

acquiring the first plurality of the components from the carrier tape with the pick up head while maintaining the carrier tape stationary during the entire acquiring step;

advancing the carrier tape so that a next plurality of electronic components are in the pick up zone; and next acquiring the next plurality of the electronic components from the carrier tape with the pick up head while maintaining the carrier tape stationary during the entire next acquiring step.

18. The method of claim 17, wherein a shutter is arranged over the pick up zone, and further comprising the step of moving the shutter so as to uncover each of the components before each component is acquired by the pick up head.

19. The method of claim 18, wherein the shutter is a multi-stage shutter, and the shutter is moved in increments, wherein each incremental movement of the shutter exposes only one of the electronic components in the pick up zone.

20. The method of claim 19, wherein the shutter is moved a plurality of increments between each advancement of the carrier tape.

21. The method of claim 19, wherein each incremental movement of the shutter removes a cover tape off of a portion of the carrier tape so as to expose the component.

22. A method of feeding electronic components in a pick and place machine having a pick up head for acquiring electronic components from a carrier tape having electronic components thereon, the method comprising the steps of:

a) advancing the carrier tape to a pick up zone so that a first plurality of the electronic components are simultaneously located within said pick up zone;

b) incrementally moving a shutter so as to uncover one of the electronic components before the one electronic component is acquired by the pick up head;

c) acquiring the one uncovered electronic component from the carrier tape with the pick up head;

d) repeating steps b) and c) while maintaining the carrier tape stationary until all of the first plurality of electronic components are acquired;

e) advancing the carrier tape so that a next plurality of electronic components are in the pick up zone; and f) repeating steps b) and c) while maintaining the carrier tape stationary until all of the next plurality of electronic components are acquired.

23. The method of claim 22, wherein each incremental movement of the shutter removes a cover tape off of a portion of the carrier tape so as to expose the component.

* * * * *